United States Patent [19]
Kusunose

[11] Patent Number: 5,428,203
[45] Date of Patent: Jun. 27, 1995

[54] ELECTRON BEAM EXPOSING APPARATUS WITH A STENCIL MASK KEPT AT A CONSTANT TEMPERATURE

[75] Inventor: Haruhiko Kusunose, Hyogo, Japan

[73] Assignee: Mitsubishi Denki Kabushiki Kaisha, Tokyo, Japan

[21] Appl. No.: 45,561

[22] Filed: Apr. 9, 1993

[30] Foreign Application Priority Data

Oct. 12, 1992 [JP] Japan .................................. 4-272736

[51] Int. Cl.⁶ .................... H01J 37/302; H01L 21/426
[52] U.S. Cl. ........................... 219/121.25; 219/121.62; 250/492.3
[58] Field of Search ........................ 219/121.25, 121.26, 219/121.27, 121.62, 121.74, 121.83, 121.86; 250/492.2, 396 R, 397, 398, 492.22, 492.3; 430/5

[56] References Cited

U.S. PATENT DOCUMENTS 5,177,365  1/1993  Yamada ............................. 250/492.2

FOREIGN PATENT DOCUMENTS 52-117567  10/1977  Japan .
62-272529  11/1987  Japan .............................. 250/492.3
1-155622   6/1989  Japan .
2-240913   9/1990  Japan .
3-20010    1/1991  Japan .

*Primary Examiner*—Geoffrey S. Evans
*Attorney, Agent, or Firm*—Lowe, Price, LeBlanc & Becker

[57] ABSTRACT

An electron beam exposing apparatus permitting the temperature of mask to be constant without affecting an electron beam. Keeping the temperature of a stencil mask 81 constant permits the position and form of an opening 69 to be constant. The temperature of a stencil mask 81 is measured by a thermal radiation to temperature transducer 72, and the magnitude of the output of a laser generator 89 is controlled by a control portion 70 based on the temperature data. A magnetic field affecting the flow of the electron beam 79 is not generated by emitting a laser beam 93.

6 Claims, 14 Drawing Sheets

ELECTRON BEAM EXPOSING APPARATUS WITH A STENCIL MASK KEPT AT A CONSTANT TEMPERATURE

BACKGROUND OF THE INVENTION

1. Field of the Invention

The present invention relates generally to electron beam exposing apparatuses, and more specifically, to stencil masks.

2. Description of the Background Art

Lithography is one step in a manufacturing process of a semiconductor device. By a lithography technique, a thin film such as a silicon oxide film is formed on a semiconductor substrate, resist is formed thereon, the resist is exposed and formed into a prescribed shape, and the thin film is etched using the resist as mask to form the thin film into a prescribed shape.

Electron beam, whose wavelength is shorter than X ray permits fine treatment. A conventional lithography technique utilizing an electron beam will be described.

As illustrated in FIG. 9, a silicon oxide film 3 is formed on a silicon substrate 1, and then resist 5 is formed thereon. As illustrated in FIG. 10, resist 5 is exposed into a prescribed shape using an electron beam. 5a denotes the exposed part, while 5b denotes the non-exposed part.

Resist 5 is developed and exposed part 5a is removed away as shown in FIG. 11. As shown in FIG. 12, silicon oxide film 3 is etched away utilizing the non-exposed part 5b of resist 5 as mask. The non-exposed part 5b of resist 5 is removed away as shown in FIG. 13. Thus, the conventional lithography utilizing electron beam is complete.

FIG. 14 is a view schematically showing a conventional electron beam exposing apparatus. The structure of the conventional electron beam exposing apparatus will be described. Disposed in a chamber 7 are, from top to bottom, an electron gun 31, an illumination lens 33, a beam forming aperture 35, a beam forming deflector 37a, a stencil mask 41, a positioning deflector 40, and an objective lens 43. An electron beam 39 is emitted from electron gun 31. Illumination lens 33 adjusts the cross sectional area of the electron beam 39 so that the electron beam 39 covers the opening portion 36 of beam forming aperture 35.

Beam forming aperture 35 at its opening portion 36 forms the cross sectional shape of the electron beam 39 into a square. The beam forming deflector is arranged as shown in FIG. 15 when viewed from above, and a beam forming deflector 37b is not illustrated in FIG. 14. Beam forming defector 37a deflects the electron beam 39 in an A direction, while beam forming deflector 37b deflects the electron beam 39 in a B direction.

Stencil mask 41 has a square opening 55 at its center as illustrated in FIG. 16. The cross sectional shape of the electron beam 39 passing through opening 55 is changed by controlling the position of the electron beam 39 by beam forming deflectors 37a and 37b.

Referring to FIG. 14, the electron beam 39 which has passed through opening 55 is deflected by positioning deflector 40. The electron beam 39 is directed at a prescribed position on a silicon wafer 45, and its adjustment is made by positioning deflector 40. The electron beam 39 having passed through positioning deflector 40 proceeds toward objective lens 43. The electron beam 39 is converged, and the converged electron beam 39 is directed at silicon wafer 45.

A description will be provided on a method of exposing a prescribed pattern on resist utilizing the electron beam exposing apparatus shown in FIG. 14. A thin film (not shown) is formed on silicon wafer 45, and resist 57 is formed thereon. When resist 57 is selectively exposed in the pattern denoted with 59, the pattern 59 is divided into 59a, 59b, and 59c shown in FIG. 18 for exposure. More specifically, the position of the electron beam 39 is controlled by beam forming deflectors 37a and 37b shown in FIG. 15 so that resist 57 is selectively exposed in the pattern denoted with 59a, and the cross sectional shape of the electron beam 39 passing through opening 55 shown in FIG. 16 is made into the shape of the pattern 59a. Similarly, resist 57 is selectively exposed in the patterns 59b and 59c.

If the electron beam 39 continuous to be directed at stencil mask 41 shown in FIG. 16, stencil mask 41 increases in temperature and is expanded. Accordingly, the shape of opening 55 changes. Meanwhile, if irradiation of the electron beam 39 is stopped, the temperature of stencil mask 41 decreases, thereby contracting stencil mask 41. Accordingly, the shape of opening 55 changes. More specifically, the shape of opening 55 is not always constant.

As illustrated in FIG. 19, it is assumed that stencil mask 41 is expanded to take a shape delineated by 41a, and opening 55 takes a shape illustrated with 55a. When the position of the electron beam 39 is controlled using opening 55 as a reference and the opening 55 takes a form illustrated by 55a, the cross sectional form of the electron beam 39 passing through the opening is different between 55 and 55a, and therefore the resist can not be exposed in a desired pattern. Furthermore, the position of exposure pattern changes.

In order to solve the above-stated problem, a material having a low coefficient of linear thermal expansion such as molybdenum is used for stencil mask 41. But the use of the material having a low coefficient of linear thermal expansion for stencil mask 41 still can not prevent the form of opening 55 from changing because of the electron beam 39 heating stencil mask 41.

A technique of keeping the form of opening of a stencil mask constant is disclosed in, for example, Japanese Patent Laying-Open No. 62-272529. FIG. 20 is a perspective view showing the stencil mask disclosed in the above-stated document. An opening 65 is provided in the center of a stencil mask 63. A heater 67 formed of a nichrome wire or the like is formed inside stencil mask 63.

The temperature of stencil mask 63 is kept at a prescribed value by the use of heater 67 thereby keeping the form of opening 65 constant. More specifically, if the temperature of stencil mask 63 is below the prescribed value, the amount of heating stencil mask 63 by heater 67 is increased, thereby returning the temperature of stencil mask 63 to the prescribed value. Meanwhile, if the temperature of stencil mask 63 is above the prescribed value, the amount of heating stencil mask 63 by heater 67 is decreased, thereby returning the temperature of stencil mask 63 to the prescribed value.

Since current is passed through heater 67 to heat stencil mask 63, a magnetic field is generated around heater 67. This affects the electron beam, the cross sectional form of the electron beam passing through opening 65 does not take a desired form and sometimes the resist can not be exposed in a desired form. Furthermore, in some cases exposure can not be made at a prescribed position.

SUMMARY OF THE INVENTION

The invention is directed to solving such a conventional problem. It is an object of the invention to provide an electron beam exposing apparatus permitting the temperature of a mask to be constant without affecting an electron beam.

An electron beam exposing apparatus in accordance with a first aspect of the invention includes an electron beam generating device for generating an electron beam, a deflecting device for deflecting the electron beam, a mask having an opening for passing the deflected electron beam, an electromagnetic wave emitting device for emitting an electromagnetic wave to the mask, thereby heating the mask, and an electromagnetic wave output control device for controlling the magnitude of the output of the electromagnetic wave emitting device so that the temperature of the mask is kept constant.

An electron beam exposing apparatus in accordance with a second aspect of the invention includes in addition to the electromagnetic wave output control device of the first aspect a passing current measuring device for measuring the current of an electron beam passing through the opening and a device for controlling the magnitude of the output of the electromagnetic wave emitting device based on the current data measured by the passing current measuring device.

An electron beam exposing apparatus in accordance with a third aspect of the invention includes in addition to the electromagnetic wave output control means of the first aspect a mask temperature measuring device for measuring the temperature of the mask and a device for controlling the magnitude of the output of the electromagnetic wave emitting device based on the temperature data measured by the mask temperature measuring device.

An electron beam exposing apparatus in accordance with a fourth embodiment of the invention includes in addition to the electromagnetic wave output control device of the first aspect a device for controlling the magnitude of the output of the electromagnetic wave emitting device based on data on the operation of a prescribed deflecting device.

According to the invention, the mask is heated by emitting an electromagnetic wave upon the mask in an electromagnetic wave emitting device. The magnitude of the output of electromagnetic wave emitting device is controlled by the electromagnetic wave output control device so that the temperature of the mask is kept constant. Since a magnetic field is not generated by emitting an electromagnetic wave, the temperature of the mask can be kept constant without affecting the electron beam.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
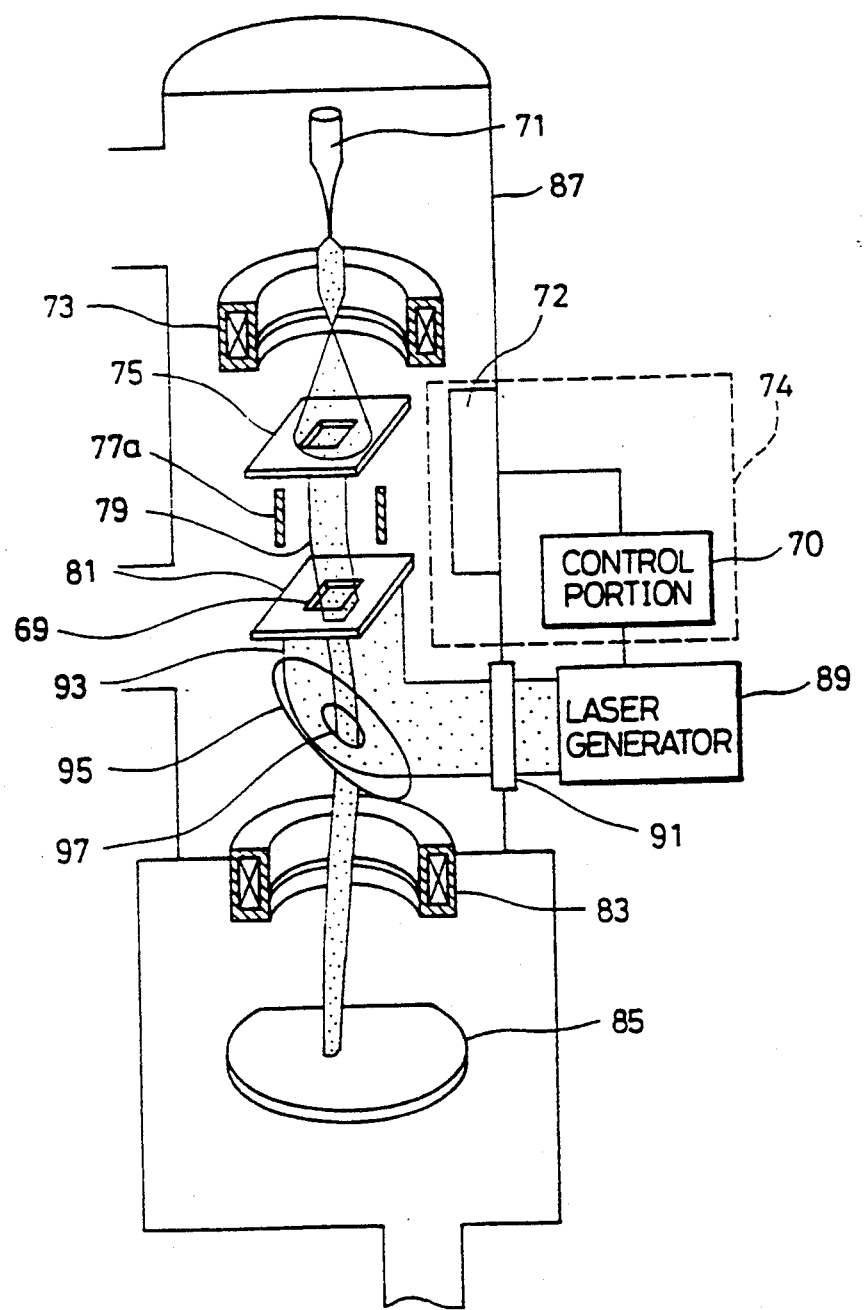
FIG. 1 is a view schematically showing an electron beam exposing apparatus in accordance with a first embodiment of the invention.
Figure 14:
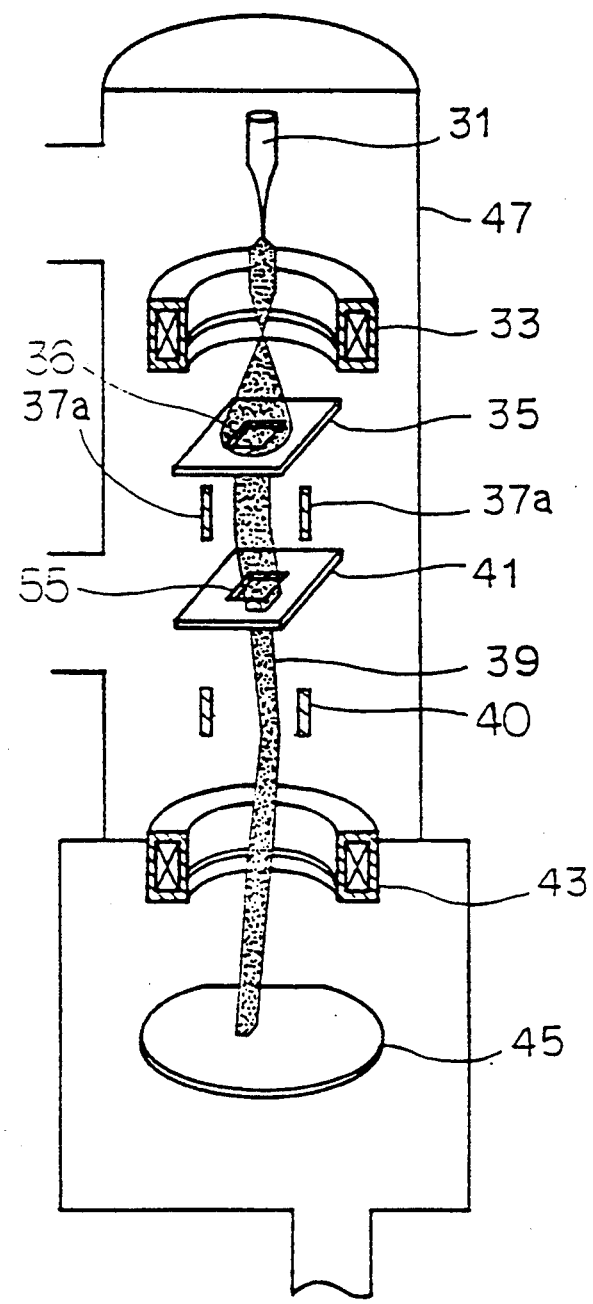
FIG. 14 is a view schematically showing a conventional electron beam exposing apparatus.
Figure 15:
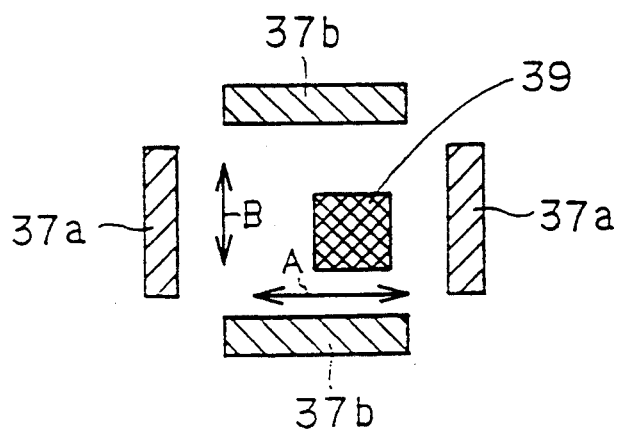
FIG. 15 is a plan view showing a beam forming deflector.
Figure 16:
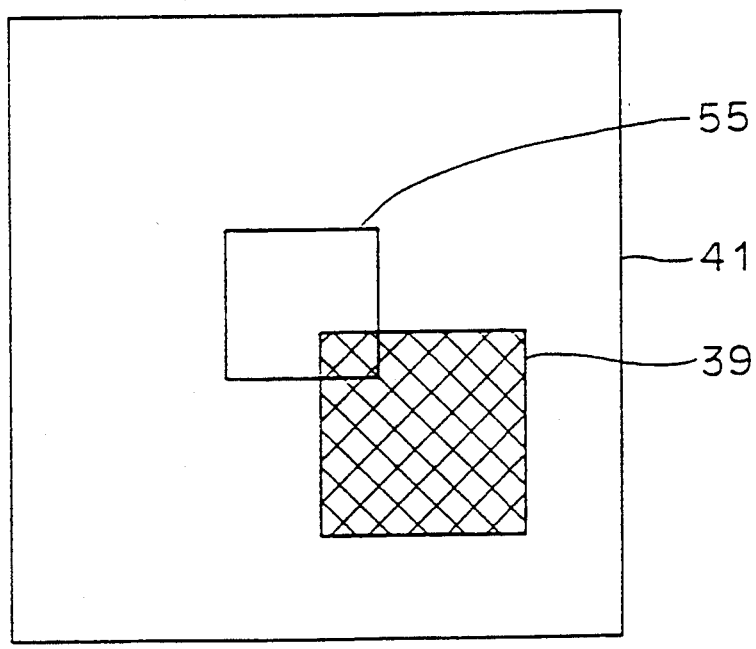
FIG. 16 is a plan view showing how an electron beam passes through the opening of a stencil masks.
Figure 17:
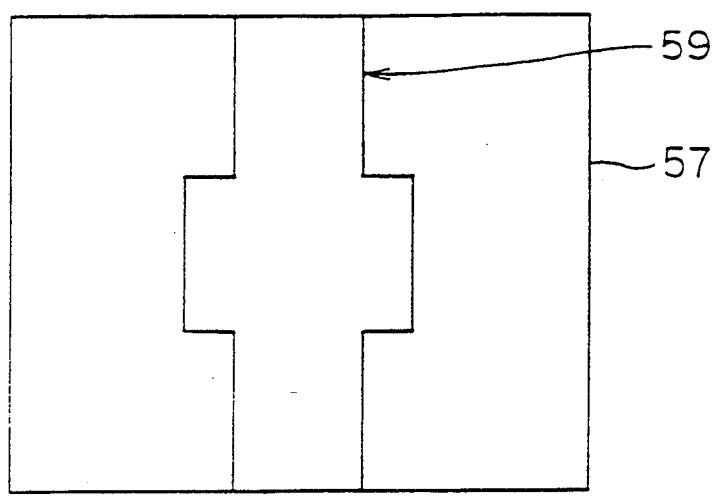
FIG. 17 is a partially enlarged plan view showing a wafer.

FIG. 1 is a view schematically showing an electron beam exposing apparatus in accordance with a first embodiment of the invention. Provided in a chamber 87 are from the top an electron gun 71, an illumination lens 73, a beam forming deflector 77a (an illustration of a beam forming deflector corresponding to beam forming deflector 37b shown in FIG. 15 is omitted), a stencil mask 81 having an opening 69, and an objective lens 83. Since the function of these elements has already been described in conjunction with the description of the electron beam exposing apparatus shown in FIG. 14 which is a conventional example, the description of the function of these elements is omitted here. 79 denotes an electron beam, and 85 a silicon wafer. An illustration of a positioning deflector is omitted.

In this embodiment, stencil mask 81 is heated by a laser beam 93. A further description will be provided. The laser beam 93 output from a laser generator 89 is transmitted through a window 91 provided at chamber 87. A reflection mirror 95 is provided between stencil mask 81 and objective lens 83, and the laser beam 93 transmitted through window 91 is reflected upon reflection mirror 95 and emitted upon stencil mask 81.

An electromagnetic wave output control portion 74 includes as an example of the mask temperature measuring device, a thermal radiation to temperature transducer 72 and a control portion 70. Thermal radiation to temperature transducer 72 detects infrared rays irradiated from stencil mask 81 and measures the temperature of stencil mask 81 based on the detected result. Control portion 70 controls the magnitude of the output of laser generator 89 based on the temperature data measured by thermal radiation to temperature transducer 72, and keeps the temperature of stencil mask 81 at a constant temperature.

An opening 97 is provided at reflection mirror 95, and the electron beam 79 passes through opening 97. An illustration of the laser beam 93 passing through opening 97 is omitted. Objective lens 83 is stopped down at the electron beam 79 passed through opening 97, and the electron 79 is then emitted upon silicon wafer 85.

It is noted that in this embodiment stencil mask 81 is heated by the laser beam 93, but the mask may be heated by another electromagnetic wave such as a visible light beam, ultraviolet rays, infrared rays, X rays or the like. Although in this embodiment the laser beam 93 is reflected upon reflection mirror 95 and emitted upon stencil mask 81, the laser beam 93 may be directly emitted upon stencil mask 81.

Second Embodiment

Figure 2:
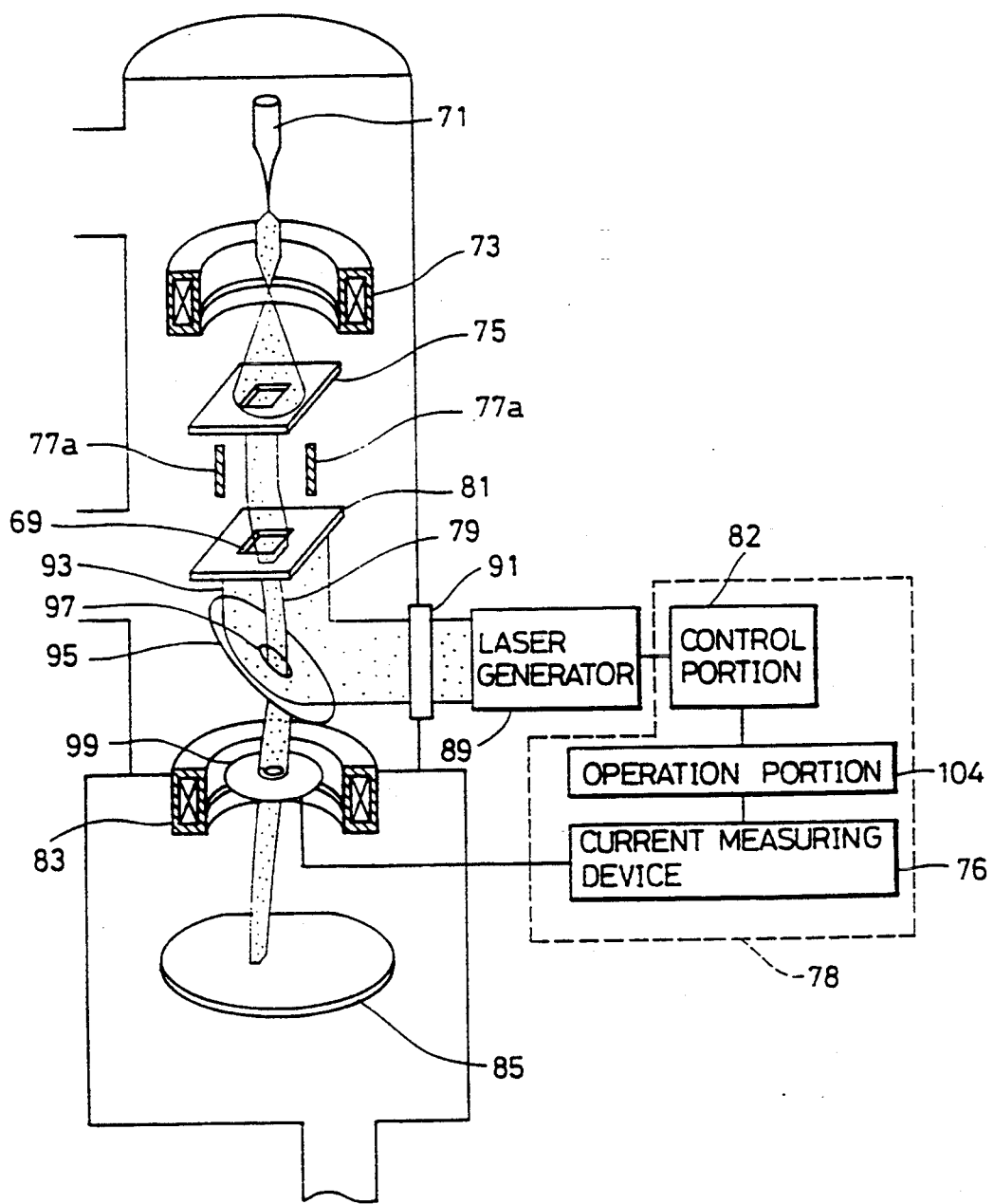
FIG. 2 is a view schematically showing an electron beam exposing apparatus in accordance with a second embodiment of the invention.

FIG. 2 is a view schematically showing an electron beam exposing apparatus in accordance with a second embodiment of the invention. Like numerals represent like elements in the first embodiment shown in FIG. 1 and description thereof will be omitted.

An electromagnetic wave output control portion 78 includes a current measuring device 76, an operation portion 104, and a control portion 82. In this embodiment, the magnitude of the output of a laser generator 89 is controlled based on current value data on an electron beam 79 passed through the opening 69 of a stencil mask 81. A further description will be provided.

Figure 3:
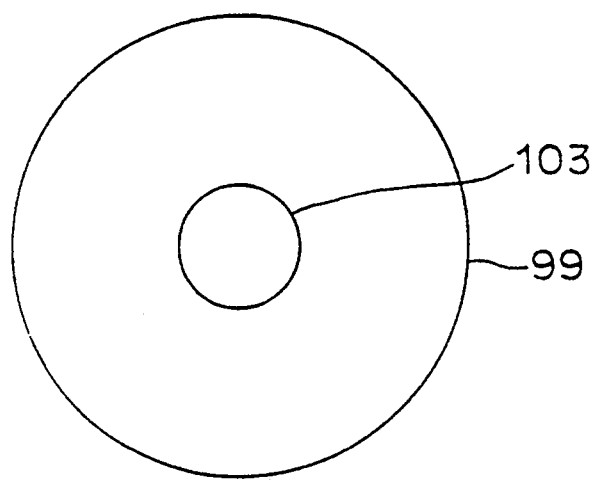
FIG. 3 is a plan view showing an aperture diaphragm.

The electron beam 79 passed through the opening 69 of stencil mask 81 proceeds toward an aperture diaphragm 99 through an opening 97. Aperture diaphragm 99 is embedded in objective lens 83. FIG. 3 is a plan view showing aperture diaphragm 99. 103 denotes an opening.

Figure 4:
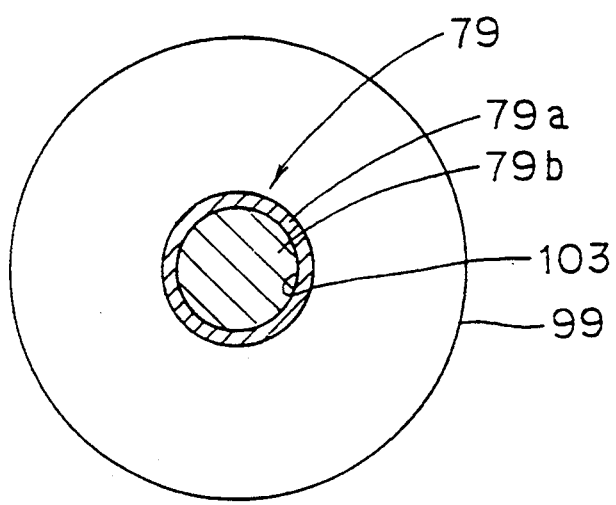
FIG. 4 is a plan view showing how a part of an electron beam passes through an aperture diaphragm.

An electron beam 79 which is a part of the electron beam 79 is passed through opening 103 as illustrated in FIG. 4, while the remaining part, an electron beam 79a is prevented from passing by aperture diaphragm 99. It is noted that the electron beam 79 is formed by the opening 69 of stencil mask 81 as illustrated in FIG. 2, and resist on silicon wafer 85 is exposed in its pattern, but since a focus is on the resist on silicon wafer 85, the resist on silicon wafer 85 exposed in the pattern is not affected if the electron beam 79 is not entirely passed through the opening 103 of aperture diaphragm 99.

Current by the electron beam 79 which has been prevented from passing by aperture diaphragm 99 is measured by current measuring device 76 shown in FIG. 2. Assume that the measured result is $I_a$. The current by the electron beam 79b at that time is represented by $KI_a$ (k is a constant).

Accordingly, the current I by the electron beam 79 passed through the opening 69 of stencil mask 81 is given as follows:

$$I = I_a + kI_a \quad (1)$$

Meanwhile, I can also be represented as follows:

$$I = JS \quad (2)$$

where J is the current density of the electron beam 79. S is the cross sectional area of the electron beam 79 which has passed through opening 69 illustrated at 96 in FIG. 5.

From equations (1) and (2), S can be represented as follows:

$$S = \{I_a(1+k)\}/J \quad (3)$$

The output P of the laser beam can be represented as follows:

$$P = mES \quad (4)$$

where m is a heating efficiency coefficient by the laser beam. E is an energy given by the electron beam to the stencil mask per unit area.

Substitution of the right term of equation (3) to S of equation (4) produces the laser output P. The above-stated operation is conducted at operation portion 104. Operation portion 104 transmits data on the laser output P to control portion 82, and control portion 82 controls the magnitude of the output of laser generator 89 based on the data.

Accordingly, in this embodiment, energy corresponding to the energy of the electron beam 79 passed through the opening 69 of stencil mask 81 is given to the stencil mask 81. Stencil mask 81 is therefore provided with a constant energy. If that constant energy continuous to be given to stencil mask 81, the amount of heat given to stencil mask 81 agrees with the amount of heat dissipation from stencil mask 81, and the temperature of stencil mask 81 is kept constant, thereby keeping the form of opening 69 constant.

Third Embodiment

Figure 6:
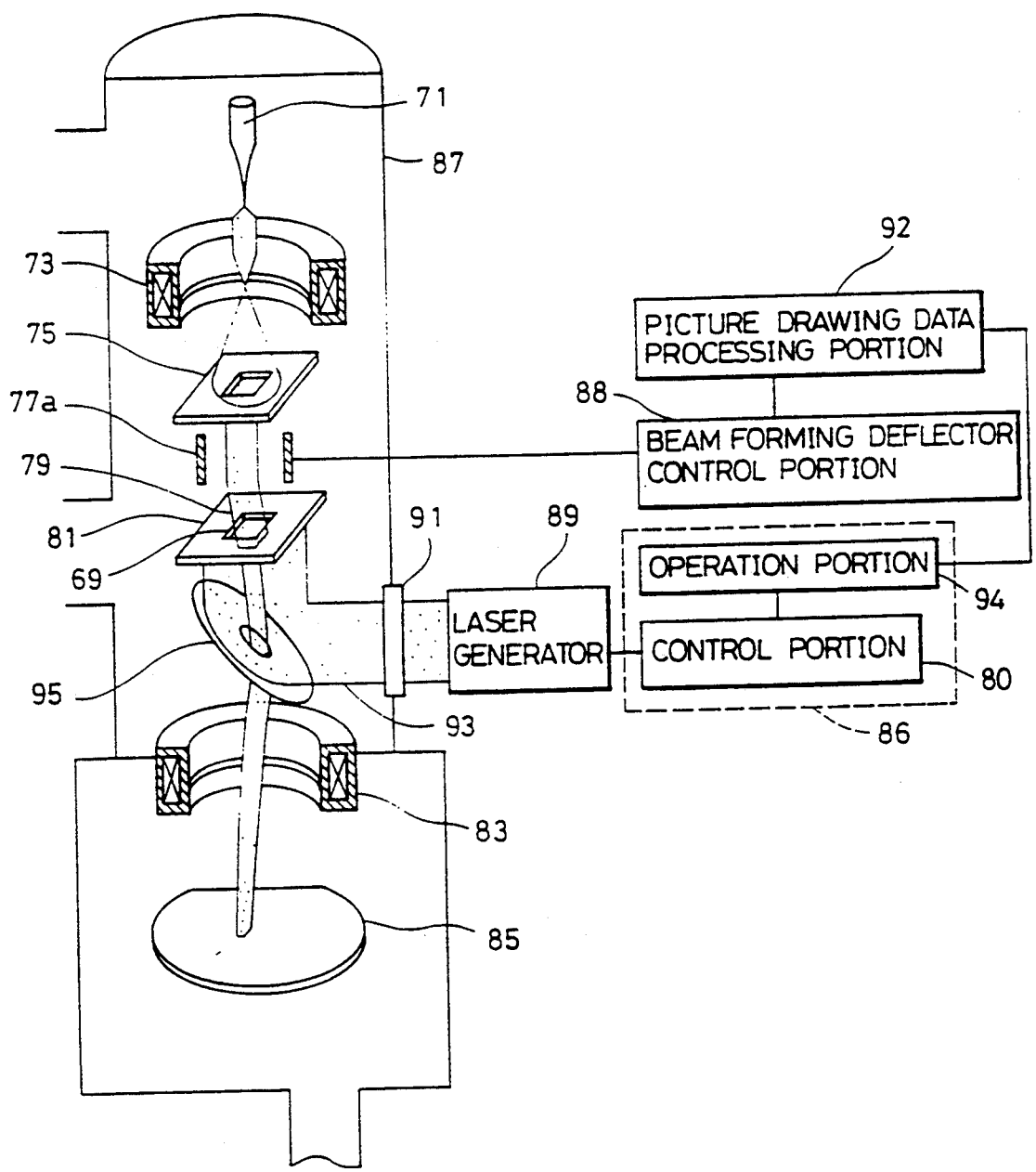
FIG. 6 is a view schematically showing an electron beam exposing apparatus in accordance with a third embodiment of the invention.

FIG. 6 is a view schematically showing a third embodiment of an electron beam exposing apparatus in accordance with the invention. Like numerals represent like elements in the first embodiment shown in FIG. 1, and description thereof will be omitted. In the third embodiment, the temperature of stencil mask 81 is kept constant in the following manner.

Figure 18:
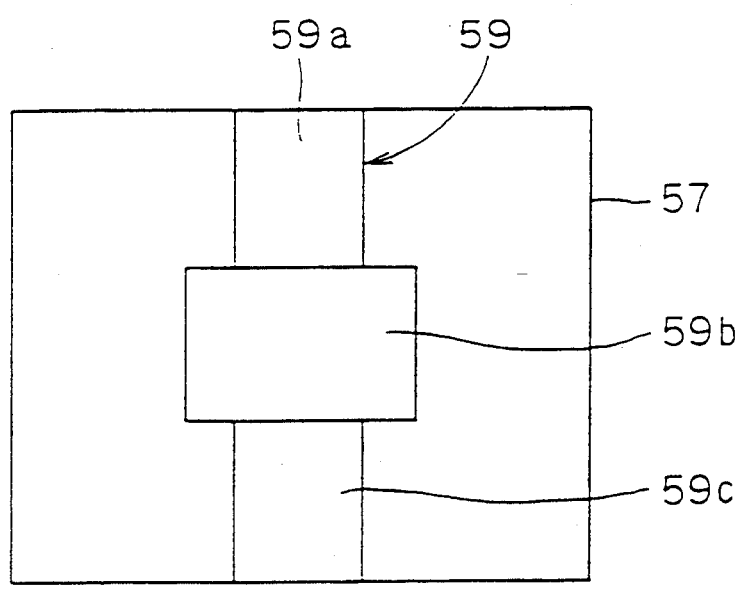
FIG. 18 is a plan view showing a pattern 59 divided into patterns 59a–59c.
Figure 19:
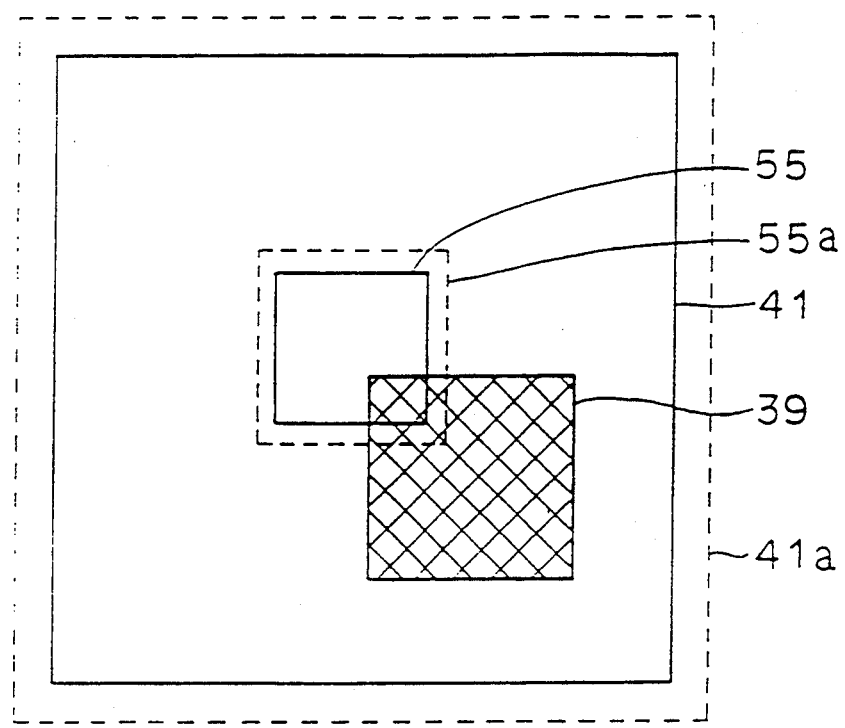
FIG. 19 is a plan view showing a stencil mask being expanded.
Figure 20:
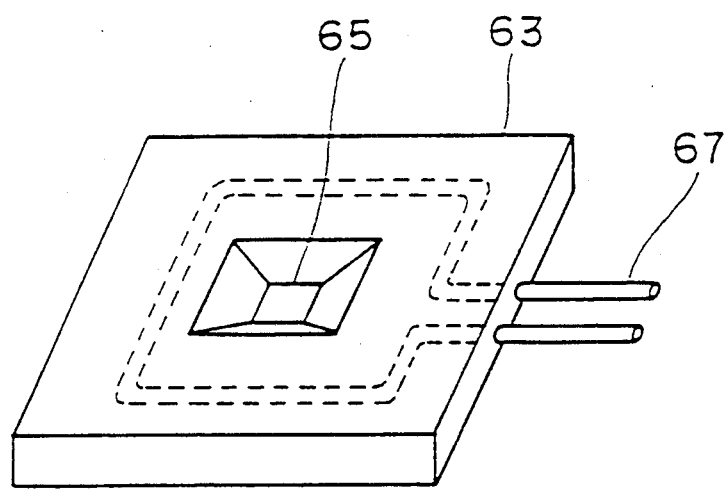
FIG. 20 is a perspective view showing a stencil mask disclosed in Japanese Patent Laying-Open No. 62-272529.

For example, if a pattern 59 shown in FIG. 18 is exposed, a processing of dividing the pattern 59 into patterns 59a–59c is conducted at a picture drawing data processing portion 92 shown in FIG. 6. A signal indicating information that the pattern 59a is to be exposed is transmitted to beam forming deflector control portion 88, and beam forming deflector control portion 88 controls beam forming deflector 77a based on the signal and deflects the electron beam 79.

Figure 5:
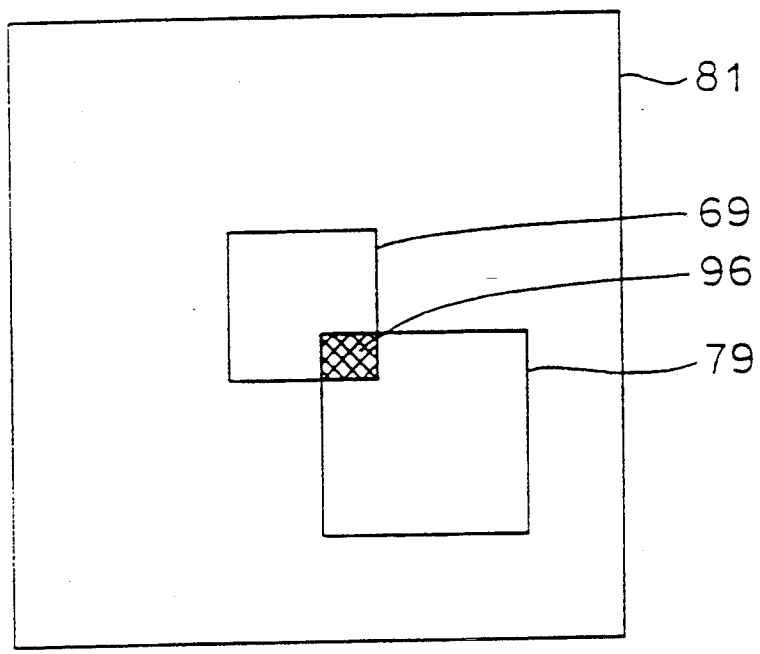
FIG. 5 is a plan view showing how an electron beam passes through the opening of a stencil mask.

In this embodiment, the signal indicating the information that the pattern 59a is to be exposed is also transmitted to the operation portion 94 of electromagnetic wave output control portion 86. The cross sectional area S (96) of the electron beam 79 passing through the opening 69 of stencil mask 81 shown in FIG. 5 is operated from the signal indicating the exposure in the pattern 59a. Substitution of the value of S into equation (4) produces a laser output P.

Data on the operated laser output is transmitted to the control portion 80, and control portion 80 controls the magnitude of the output of laser generator 89 based on the data. More specifically, in the third embodiment, energy corresponding to the energy of the electron beam 79 passing through the opening 69 of stencil mask 81 is given to stencil mask 81 by the laser beam 93 as is the case with the second embodiment. Accordingly, stencil mask 81 is always provided with constant energy. Thus, the temperature of stencil mask 81 is kept constant.

Fourth Embodiment

Figure 8:
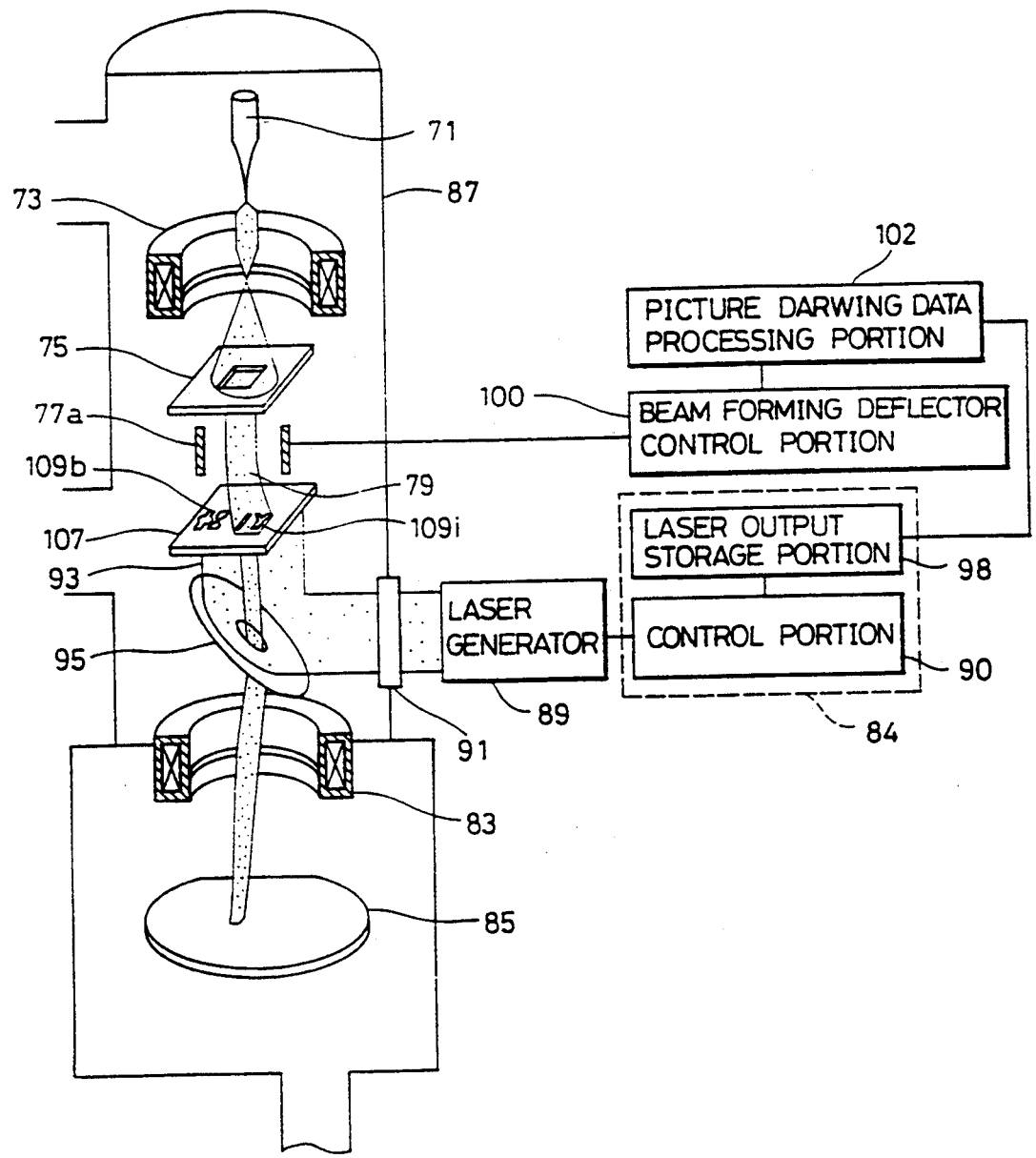
FIG. 8 is a view schematically showing an electron beam exposing apparatus in accordance with a fourth embodiment of the invention.
Figure 9:
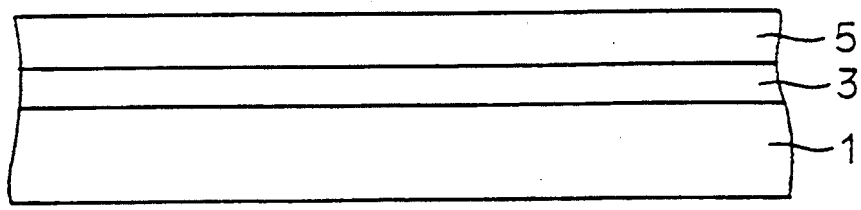
FIGS. 9–13 are cross sectional views showing steps (1st–5th) in a conventional process of exposing with an electron beam.
Figure 10:
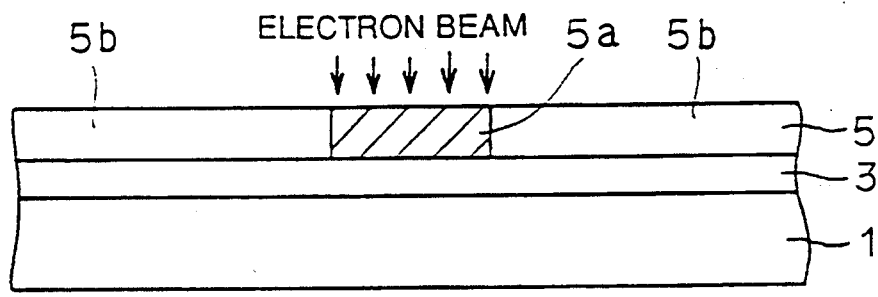
Figure 11:
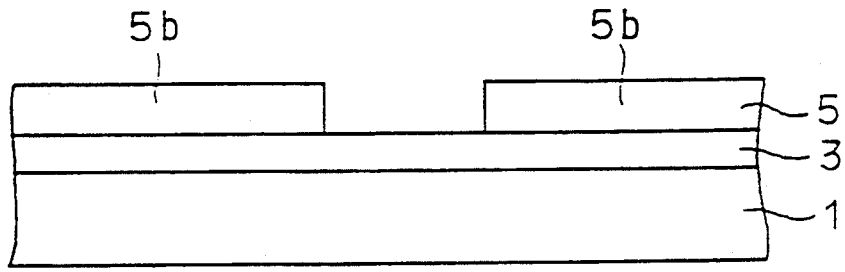
Figure 12:
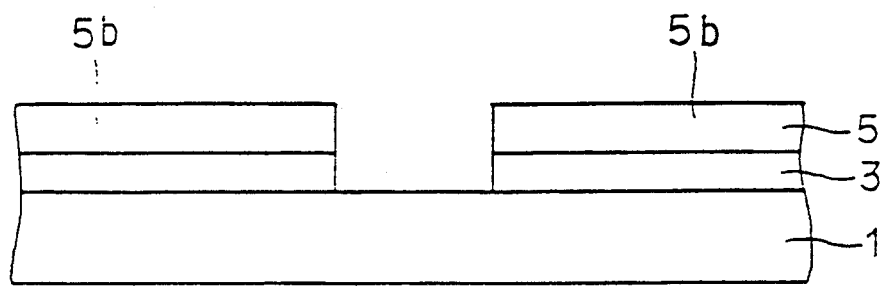
Figure 13:
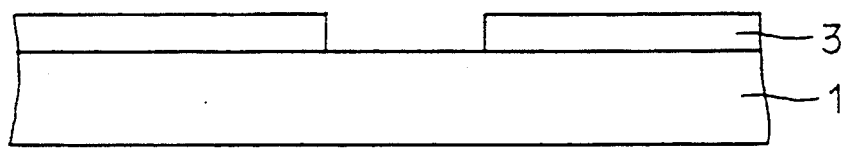

FIG. 8 is a view schematically showing an electron beam exposing apparatus in accordance with a fourth embodiment of the invention. Like numerals represent like elements in FIG. 1, and description thereof will be omitted. The fourth embodiment is an electron beam exposing apparatus of a cell projection type.

Figure 7:
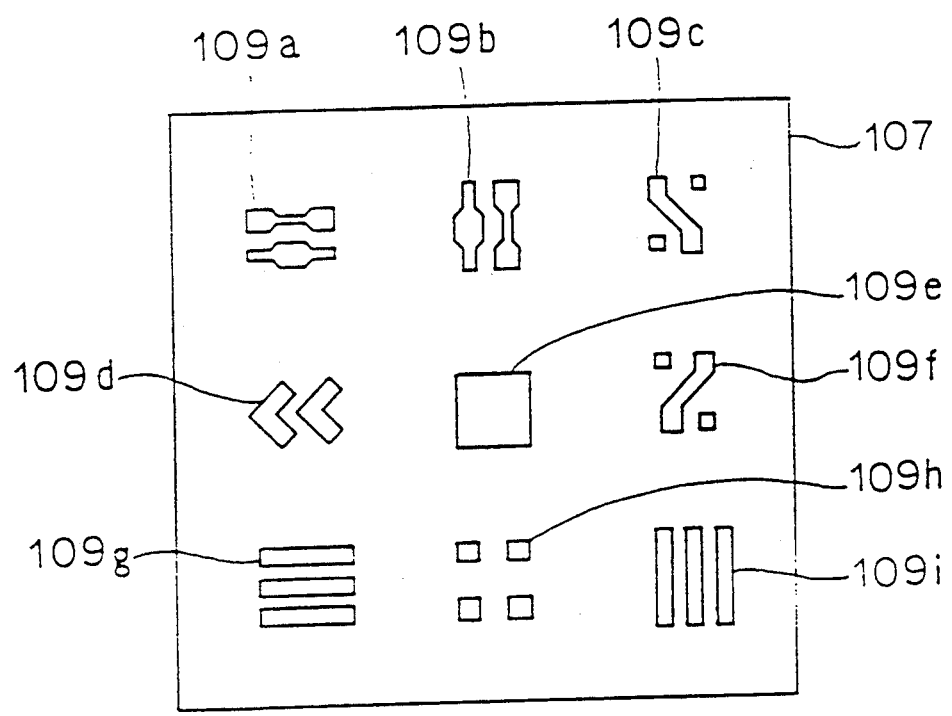
FIG. 7 is a plan view showing a stencil mask for use in an electron beam exposing apparatus of a cell projection type.

The cell projection type employs a mask as shown in FIG. 7 as a stencil mask. Stencil mask 107 has patterns 109a–109i formed thereon. If patterns often used in the manufacture of semiconductor devices are formed on stencil mask 107 beforehand, exposure of the patterns can quickly be conducted. This is called the cell projection type.

A description will be provided on an operation of the embodiment in conjunction with FIG. 8. If, for example, resist exposed in the pattern 109i, a picture drawing data processing portion 102 transmits to beam forming deflector control portion 100 a signal indicating that the resist is to be exposed in the pattern 109i, and beam forming deflector control portion 100 controls beam forming deflector 77a based on the signal and deflects the electron beam 79 so that the electron beam 79 comes on the pattern 109i.

The signal indicating the exposure in the pattern 109i is also transmitted to the laser output storage portion 98 of the electromagnetic wave output control portion 84. Laser outputs corresponding to the electron beam outputs passing through the patterned 109a–109i, respectively are stored in the laser output storage portion 98. More specifically, the values produced by substituting the respective areas of patterns 109a–109i into S of equation (4) are stored therein.

Laser output storage portion 98 transmits laser output data corresponding to the electron beam output passing through the pattern 109i to control portion 90. Control portion 90 controls the magnitude of the output of laser generator 89 so that this laser output is given to a stencil mask 107. Thus, stencil mask 107 is always provided with constant power and, therefore, the temperature of stencil mask 107 is kept constant.

In this embodiment, the laser outputs corresponding to the electron beam outputs passing through the patterns 109a–109i, respectively are previously stored in laser output storage portion 98, and therefore operation of the laser outputs is not necessary.

According to the invention, the temperature of the mask is kept constant by the use of an electromagnetic wave. A magnetic field is not generated by emitting an electromagnetic wave, and, therefore, the temperature of the mask can be kept constant without affecting an electron beam.

Furthermore, since the temperature of the mask is kept constant, the form and position of the opening of the mask is kept constant, thus permitting accurate exposure of the resist in a desired pattern.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electron beam exposing apparatus exposing resist to an electron beam, comprising:
   electron beam generation means for generating said electron beam;
   deflecting means for deflecting said electron beam;
   a mask having an opening passing said deflected electron beam;
   electromagnetic wave emitting means for emitting an electromagnetic wave upon said mask thereby heating said mask; and
   electromagnetic wave output control means for controlling the magnitude of the output of said electromagnetic wave emitting means so that the temperature of said mask is kept constant.

2. An electron beam exposing apparatus as recited in claim 1, wherein
   said electromagnetic wave output control means includes,
   passing current measuring means for measuring the current of said electron beam passing through said opening, and
   means for controlling the magnitude of the output of said electromagnetic wave emitting means based on the current data measured by said passing current measuring means.

3. An electron beam exposing apparatus as recited in claim 2, wherein
   said passing current measuring means includes,
   current measuring means for measuring the current of said electron beam passing through said opening, and
   operation means for operating the output of said electromagnetic wave given to said mask from the current value measured by said current measuring means.

4. An electron beam exposing apparatus as recited in claim 3, wherein
   said current measuring means includes,
   blocking means having a hole portion passing a part of said electron beam passing through said opening, and
   means for measuring current corresponding to the remaining part of said electron beam prevented from passing by said blocking means.

5. An electron beam exposing apparatus as recited in claim 1, wherein
   said electromagnetic wave output control means includes,
   mask temperature measuring means for measuring the temperature of said mask, and
   means for controlling the magnitude of the output of said electromagnetic wave emitting means based on the temperature data measured by said mask temperature measuring means.

6. An electromagnetic exposing apparatus as recited in claim 1, wherein
   said electromagnetic wave output control means includes means for controlling the magnitude of the output of said electromagnetic wave emitting means based on prescribed operation data on said deflecting means.

* * * * *